(12) United States Patent
Philipp et al.

(10) Patent No.: US 7,671,353 B2
(45) Date of Patent: Mar. 2, 2010

(54) INTEGRATED CIRCUIT HAVING CONTACT INCLUDING MATERIAL BETWEEN SIDEWALLS

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 274 days.

(21) Appl. No.: 11/757,712

(22) Filed: Jun. 4, 2007

(65) Prior Publication Data

US 2008/0296553 A1 Dec. 4, 2008

(51) Int. Cl.
*H01L 47/00* (2006.01)
(52) U.S. Cl. .................. 257/2; 257/4; 257/E31.029
(58) Field of Classification Search ............ 257/2, 257/3, 4, 5, 9, E31.029
See application file for complete search history.

(56) References Cited

U.S. PATENT DOCUMENTS

2006/0011902 A1 1/2006 Song et al.
2006/0157680 A1* 7/2006 Takaura et al. ............... 257/3
2007/0190696 A1* 8/2007 Happ ...................... 438/128
2008/0266932 A1* 10/2008 Happ et al. ................. 365/148

OTHER PUBLICATIONS

"Full Integration and Reliability Evaluation of Phase-change RAM Based on .24um-CMOS Technologies", Y.N. Hwang, et al., Symposium on VLSI Technology Digest of Technical Papers, 2003. (2 pgs.).
"Highly Manufacturable High Density Phase Change Memory of 64Mb and Beyond", S. J. Ahn, et al., IEEE, 2004. (4. pgs.).
"A .1 um 1.8V 256Mb 66MHz Synchronous Burst PRAM", Sangbeom Kang, et al., ISSCC, 2006. (3 pgs.).

* cited by examiner

*Primary Examiner*—Hoai V Pham
(74) *Attorney, Agent, or Firm*—Dicke, Billig & Czaja, PLLC

(57) ABSTRACT

An integrated circuit includes a bottom electrode, a top electrode, resistivity changing material between the bottom electrode and the top electrode, and a contact contacting the top electrode. The contact includes a bottom and sidewalls. The integrated circuit includes first material between the sidewalls of the contact.

31 Claims, 3 Drawing Sheets

INTEGRATED CIRCUIT HAVING CONTACT INCLUDING MATERIAL BETWEEN SIDEWALLS

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

One type of phase change memory cell includes phase change material between a bottom electrode and a top electrode. A contact couples the top electrode to upper metallization layers. To reduce the power used to program the phase change material to an amorphous state, heat loss from the phase change material during programming should be minimized.

For these and other reasons, there is a need for the present invention.

SUMMARY

One embodiment provides an integrated circuit. The integrated circuit includes a bottom electrode, a top electrode, resistivity changing material between the bottom electrode and the top electrode, and a contact contacting the top electrode. The contact includes a bottom and sidewalls. The integrated circuit includes first material between the sidewalls of the contact.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
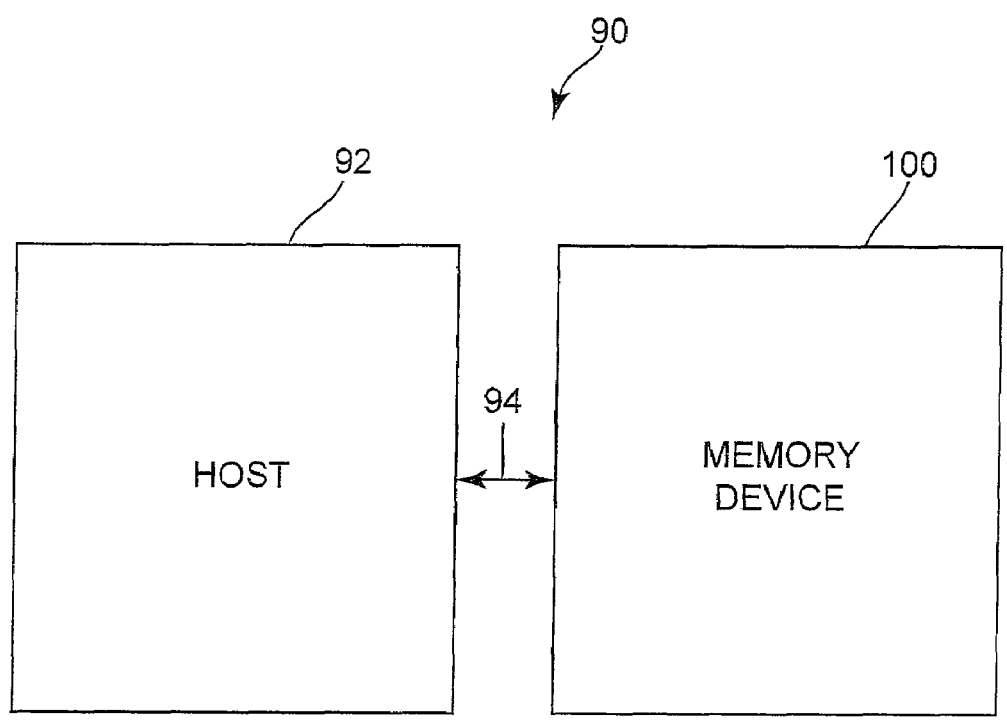
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing material memory device.

Figure 2:
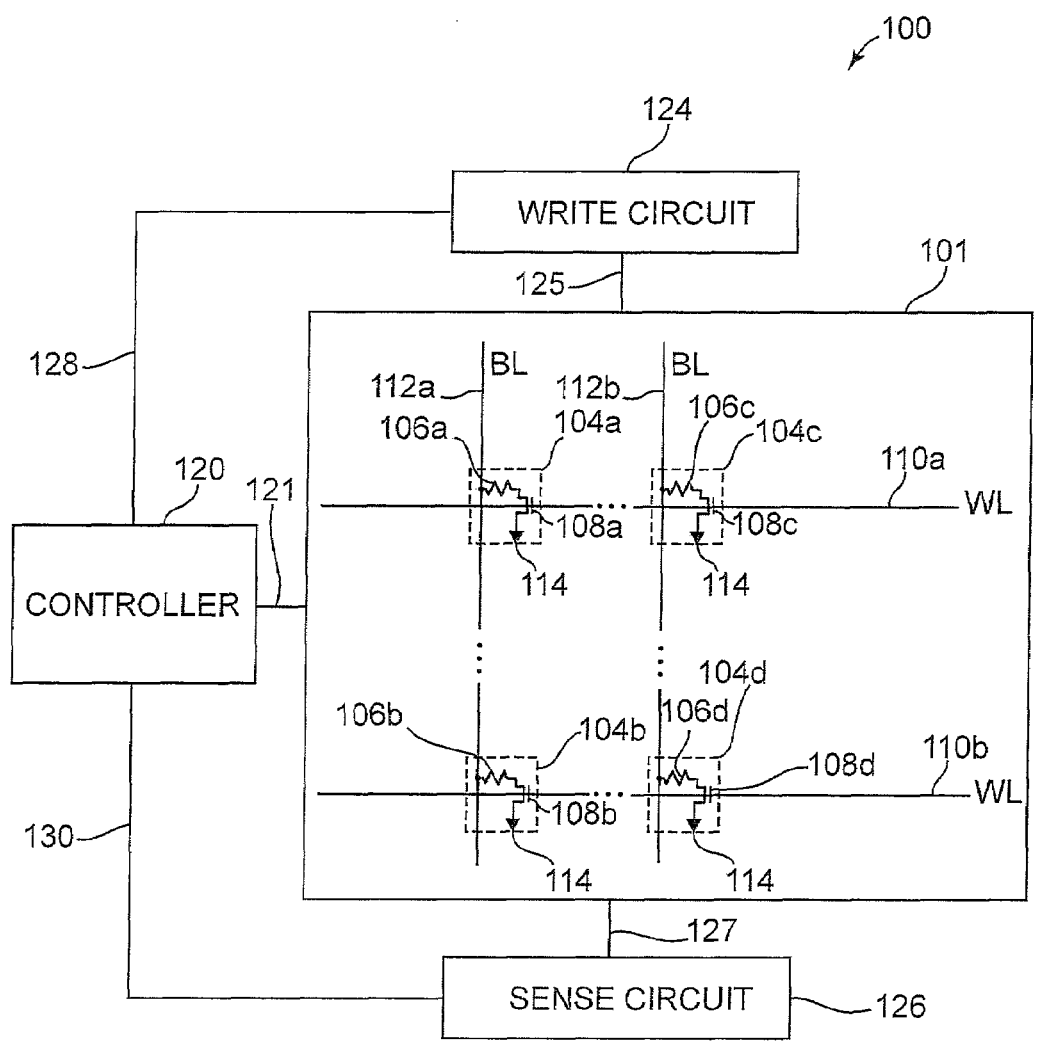
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Each phase change memory cell 104 includes a cup-shaped or U-shaped contact for reducing heat loss from the phase change material within each memory cell 104 during programming. The bottom and sidewalls of each contact includes an electrically conductive material. A dielectric material or semiconducting material having low thermal conductively is disposed between the sidewalls of each contact.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In one embodiment, sense circuit 126 provides voltage across one of the memory cells 104 and reads the current that flows through that one of the memory cells 104. In one embodiment, write circuit 124 provides voltage across one of the memory cells 104 and sense circuit 126 reads the current that flows through that one of the memory cells 104. In one embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101 are set and reset similarly to phase change memory cell 104a using a similar current or voltage pulse.

Figure 3:
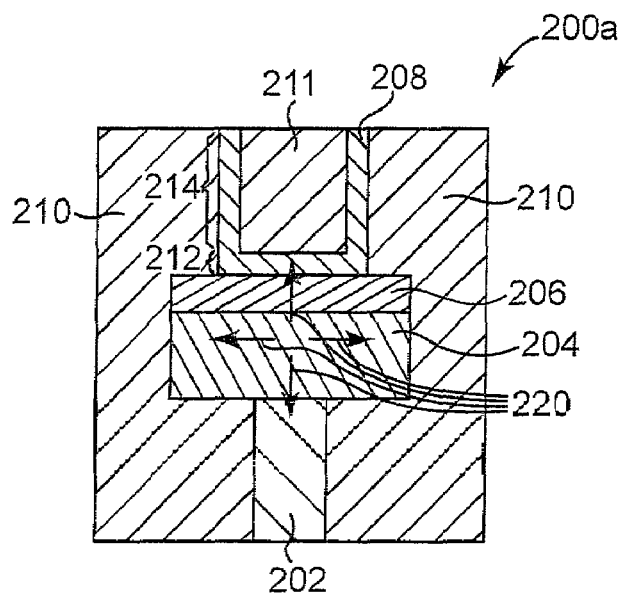
FIG. 3 illustrates a cross-sectional view of one embodiment of a phase change element.

FIG. 3 illustrates a cross-sectional view of one embodiment of a phase change element 200a. In one embodiment, each phase change element 106 is similar to phase change element 200a. Phase change element 200a includes a bottom electrode 202, a phase change material storage location 204, a top electrode 206, a contact 208, dielectric or semiconducting material 211, and dielectric material 210. In one embodiment, phase change material storage location 204 is a mushroom phase change material storage location. In this embodiment, phase change material storage location 204 is formed by depositing and patterning a layer of phase change material over bottom electrode 202. Contact 208 includes a bottom portion 212 and sidewall portions 214.

Bottom electrode 202 includes TiN, TaN, W, Al, Ti, Ta, TiSiN, TaSiN, TiAlN, TaAlN, Cu, WN, C, or other suitable electrode material. The top of bottom electrode 202 contacts the bottom of phase change material storage location 204. In one embodiment, phase change material storage location 204 has a larger cross-sectional width than bottom electrode 202. Phase change material storage location 204 provides a storage location for storing one or more bits of data. The active or phase change region in phase change material storage location 204 is at the interface between phase change material storage location 204 and bottom electrode 202. The top of phase change material storage location 204 contacts the bottom of top electrode 206. In one embodiment, top electrode 206 has the same cross-sectional width as phase change material storage location 204. Top electrode 206 includes TiN, TaN, W, Al, Ti, Ta, TiSiN, TaSiN, TiAlN, Cu, WN, C, or other suitable electrode material.

The top of top electrode 206 contacts the bottom 212 of contact 208. In one embodiment, the bottom 212 of contact 208 has a smaller cross-sectional width than top electrode 206. Contact 208 includes TiN, TaN, TiSiN, TaSiN, TiAlN, WN, or other suitable contact material. In one embodiment, bottom portion 218 and sidewall portions 214 of contact 208 provide a cup-shaped contact. In another embodiment, bottom portion 218 and sidewall portions 214 of contact 208 provide a U-shaped contact. In one embodiment, U-shaped contact 208 contacts at least two top electrodes 206 along a row or column of memory array 101. In another embodiment, U-shaped contact 208, top electrode 206, and phase change material 204 extend over two or more bottom electrodes 202 along a row or column of memory array 101 to provide multiple phase change elements.

In any embodiment, sidewall portions 214 laterally enclose dielectric or semiconducting material 211. Dielectric or semiconducting material 211 includes $SiO_2$, $SiO_x$, SiN, fluorinated silica glass (FSG), boro-phosphorous silicate glass (BPSG), boro-silicate glass (BSG), low-k material, or other suitable dielectric material or semiconducting material. Bottom electrode 202, phase change material 204, top electrode 206, and contact 208 are laterally surrounded by dielectric material 210. Dielectric material 210 includes $SiO_2$, $SiO_x$, SiN, FSG, BPSG, BSG, or other suitable dielectric material.

The current path through memory element 200a is from contact 208 through top electrode 206 and phase change material storage location 204 to bottom electrode 202. In another embodiment, the current path is reversed. The heat loss within phase change element 200a during a programming operation is indicated by arrows 220 extending away from phase change material storage location 204. Compared to a typical contact including a solid block of material, cup-shaped or U-shaped contact 208 reduces the heat loss in the upper direction due to the relatively thin bottom portion 212 that is covered with dielectric or semiconducting material 211. Contact 208 reduces the heat loss from phase change material storage location 204 during programming, thus reducing the power used to program phase change element 200a.

During operation, current or voltage pulses are applied between contact 208 and bottom electrode 202 to program phase change element 200a. During a set operation of phase change element 200a, a set current or voltage pulse is selectively enabled by write circuit 124 and sent through a bit line to contact 208. From contact 208, the set current or voltage pulse passes through top electrode 206 and phase change material storage location 204 thereby heating the phase change material above its crystallization temperature (but usually below its melting temperature). In this way, the phase change material reaches a crystalline state or a partially crystalline and partially amorphous state during the set operation.

During a reset operation of phase change element 200a, a reset current or voltage pulse is selectively enabled by write circuit 124 and sent through a bit line to contact 208. From contact 208, the reset current or voltage pulse passes through top electrode 206 and phase change material storage location 204. The reset current or voltage quickly heats the phase change material above its melting temperature. After the current or voltage pulse is turned off, the phase change material quickly quench cools into an amorphous state or a partially amorphous and partially crystalline state.

Figure 4:
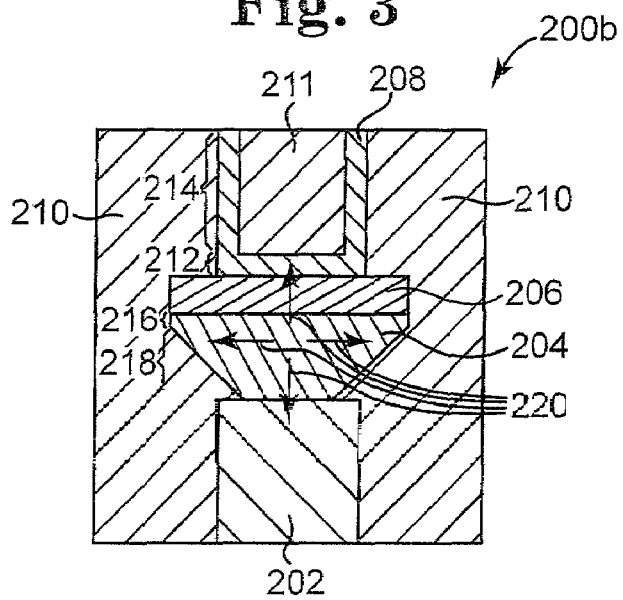
FIG. 4 illustrates a cross-sectional view of another embodiment of a phase change element.

FIG. 4 illustrates a cross-sectional view of another embodiment of a phase change element 200b. In one embodiment, each phase change element 106 is similar to phase change element 200b. Phase change element 200b is similar to phase change element 200a previously described and illustrated with reference to FIG. 3, except that in phase change element 200b, phase change material storage location 204 includes a first portion 216 and a second portion 218. In one embodiment, phase change material storage location 204 is a pore phase change material storage location. In this embodiment, phase change material storage location 204 is formed by depositing phase change material into a pore defined in dielectric material 210.

In this embodiment, the first portion 216 of phase change material 204 is tapered such that at the interface between phase change material 204 and bottom electrode 202, phase change material 204 has a smaller cross-sectional width than bottom electrode 202. In one embodiment, second portion 218 of phase change material 204 has the same cross-sectional width as top electrode 206. Phase change element 200b is programmed similarly to phase change element 200a previously described and illustrated with reference to FIG. 3.

Figures 5, 6:
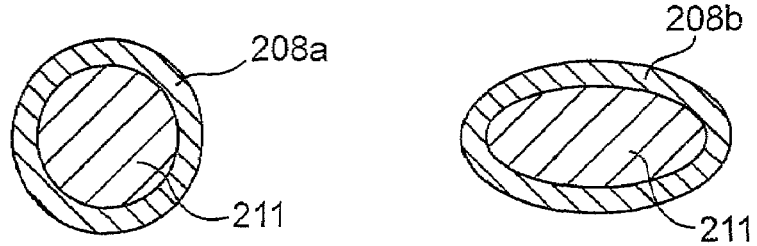
FIG. 5 illustrates a top view of one embodiment of a contact.
FIG. 6 illustrates a top view of another embodiment of a contact.

FIG. 5 illustrates a top view of one embodiment of a contact 208a. In one embodiment, contact 208a is used for contact 208 in phase change element 200a previously described and illustrated with reference to FIG. 3 and in phase change element 200b previously described and illustrated with reference to FIG. 4. In this embodiment, contact 208a has a circular or ring shaped cross-section. Contact 208a encloses dielectric or semiconducting material 211.

FIG. 6 illustrates a top view of another embodiment of a contact 208b. In one embodiment, contact 208b is used for contact 208 in phase change element 200a previously described and illustrated with reference to FIG. 3 and in phase change element 200b previously described and illustrated with reference to FIG. 4. In this embodiment, contact 208b has an elliptical or oblong shaped cross-section. Contact 208b encloses dielectric or semiconducting material 211. In other embodiments, square, rectangular, polygonal, or other suitable shapes can be used for contact 208.

After fabricating top electrode 206, contact 208 is fabricated. To fabricate contact 208, a first dielectric material, such as $SiO_2$, $SiO_x$, SiN, FSG, BPSG, BSG, or other suitable dielectric material is deposited over top electrode 206 to provide a first dielectric material layer. The first dielectric material layer is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. The first dielectric material layer is then etched to providing an opening. In one embodiment, the opening is a circular, oblong, or other suitable contact-like opening exposing a portion of top electrode 206. In another embodiment, the opening is a trench exposing two or more top electrodes 206 along a row or column of the array of memory cells.

A contact material, such as TiN, TaN, TiSiN, TaSiN, TiAlN, WN, or other suitable contact material is conformally deposited over exposed portions of the etched first dielectric material layer and the top electrodes 206. The contact material layer is deposited using CVD, HDP-CVD, ALD, MOCVD, PVD, JVD, or other suitable deposition technique. A second dielectric material or semiconducting material, such as $SiO_2$, $SiO_x$, SiN, FSG, BPSG, BSG, low-k material or other suitable dielectric or semiconducting material is deposited over the contact material layer to provide a second dielectric material or semiconducting material layer. The second dielectric material or semiconducting material layer is deposited using CVD, HDP-CVD, ALD, MOCVD, PVD, JVD, or other suitable deposition technique. The second dielectric material or semiconducting material layer and the contact material layer are then planarized to expose the first dielectric material layer and to provide contacts 208 as previously described and illustrated with reference to FIGS. 3-6.

Embodiments of the present invention provide phase change memory cells including cup-shaped or U-shaped contacts. The cup-shaped or U-shaped contacts reduce the heat loss from the phase change material during programming of the memory cells. By reducing the heat loss, the contacts reduce the current used to program the memory cells.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a bottom electrode;
   a top electrode;
   resistivity changing material between the bottom electrode and the top electrode;
   a contact contacting the top electrode, the contact including a bottom and sidewalls; and
   first material between the sidewalls of the contact,
   wherein the first material comprises dielectric material.

2. The integrated circuit of claim 1, wherein the contact comprises a cup-shaped contact.

3. The integrated circuit of claim 2, wherein the cup-shaped contact has a circular cross-section.

4. The integrated circuit of claim 2, wherein the cup-shaped contact has an oblong cross-section.

5. The integrated circuit of claim 1, wherein the contact comprises a U-shaped contact.

6. The integrated circuit of claim 1, wherein the resistivity changing material comprises a phase change material.

7. An integrated circuit comprising:
   a bottom electrode;
   a top electrode;
   resistivity changing material between the bottom electrode and the top electrode;
   a contact contacting the top electrode, the contact including a bottom and sidewalls; and
   first material between the sidewalls of the contact,
   wherein the first material comprises semiconducting material.

8. The integrated circuit of claim 7, wherein the contact comprises a cup-shaped contact.

9. The integrated circuit of claim 8, wherein the cup-shaped contact has a circular cross-section.

10. The integrated circuit of claim 8, wherein the cup-shaped contact has an oblong cross-section.

11. The integrated circuit of claim 7, wherein the contact comprises a U-shaped contact.

12. The integrated circuit of claim 7, wherein the resistivity changing material comprises a phase change material.

13. A system comprising:
   a host; and
   a memory device communicatively coupled to the host, the memory device including a plurality of memory cells, each memory cell comprising:
      a bottom electrode;
      a top electrode;
      phase change material between the bottom electrode and the top electrode;
      a contact contacting the top electrode, the contact including a bottom and sidewalls; and
      first material between the sidewalls of the contact,
      wherein the first material comprises dielectric material.

14. The system of claim 13, wherein each contact comprises a cup-shaped contact.

15. The system of claim 14, wherein each cup-shaped contact has a circular cross-section.

16. The system of claim 14, wherein each cup-shaped contact has an oblong cross-section.

17. The system of claim 13, wherein each contact comprises a U-shaped contact.

18. The system of claim 13, wherein the memory device further comprises:
   an access device coupled to the bottom electrode.

19. The system of claim 13, wherein the memory device further comprises:
   a sense circuit configured to read data stored in the phase change material;
   a write circuit configured to write data to the phase change material; and
   a controller configured to control the sense circuit and the write circuit.

20. A system comprising:
   a host; and
   a memory device communicatively coupled to the host, the memory device including a plurality of memory cells, each memory cell comprising:
      a bottom electrode;
      a top electrode;
      phase change material between the bottom electrode and the top electrode;
      a contact contacting the top electrode, the contact including a bottom and sidewalls; and
      first material between the sidewalls of the contact,
      wherein the first material comprises semiconducting material.

21. The system of claim 20, wherein each contact comprises a cup-shaped contact.

22. The system of claim 21, wherein each cup-shaped contact has a circular cross-section.

23. The system of claim 21, wherein each cup-shaped contact has an oblong cross-section.

24. The system of claim 20, wherein each contact comprises a U-shaped contact.

25. The system of claim 20, wherein the memory device further comprises:
   an access device coupled to the bottom electrode.

26. The system of claim 20, wherein the memory device further comprises:
   a sense circuit configured to read data stored in the phase change material;
   a write circuit configured to write data to the phase change material; and
   a controller configured to control the sense circuit and the write circuit.

27. A memory comprising:
   a first bottom electrode;
   a first top electrode;
   first phase change material between the first bottom electrode and the first top electrode;
   a second bottom electrode;
   a second top electrode;
   second phase change material between the second bottom electrode and the second top electrode;
   a contact contacting the first top electrode and the second top electrode, the contact including a bottom and sidewalls extending between the first top electrode and the second top electrode; and
   first material between the sidewalls of the contact,
   wherein the first material comprises one of dielectric material and semiconducting material.

28. The memory of claim 27, wherein a cross-sectional width of the first phase change material is greater than a cross-sectional width of the first bottom electrode.

29. The memory of claim 27, wherein a cross-sectional width of the first phase change material is less than a cross-sectional width of the first bottom electrode.

30. The memory of claim 27, wherein the first phase change material comprises a tapered portion.

31. The memory of claim 27, wherein the contact is centered over the first top electrode and the second top electrode.

* * * * *